(12) United States Patent
Murata et al.

(10) Patent No.: US 7,067,918 B2
(45) Date of Patent: Jun. 27, 2006

(54) WIRING BOARD

(75) Inventors: Haruhiko Murata, Aichi (JP);
Kazuhisa Sato, Kounan (JP);
Tomonori Matsuura, Komaki (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/802,885

(22) Filed: Mar. 18, 2004

(65) Prior Publication Data

US 2004/0227239 A1 Nov. 18, 2004

(30) Foreign Application Priority Data

Mar. 18, 2003 (JP) ............................ P.2003-073767

(51) Int. Cl.
*H01L 23/48* (2006.01)
(52) U.S. Cl. ...................... 257/751; 257/736
(58) Field of Classification Search ................ 257/736, 257/748, 750, 751, 762, 766, 772
See application file for complete search history.

(56) References Cited

U.S. PATENT DOCUMENTS

| | | | |
|---|---|---|---|
| 5,235,139 A * | 8/1993 | Bengston et al. ........... | 174/257 |
| 5,364,460 A | 11/1994 | Morimoto et al. | |
| 6,495,211 B1 | 12/2002 | Iba et al. | |
| 6,815,126 B1 * | 11/2004 | Fey et al. ..................... | 430/9 |
| 2001/0053562 A1 | 12/2001 | Iba et al. | |
| 2003/0096064 A1 | 5/2003 | Suda et al. | |

FOREIGN PATENT DOCUMENTS

| | | |
|---|---|---|
| JP | 6-330336 | 11/1994 |
| JP | 2002-4098 | 1/2002 |
| JP | 2003-13248 | 1/2003 |

OTHER PUBLICATIONS

Ning-Cheng Lee, "Lead-Free Chip-Scale Soldering of Packages," Chip Scale Review (Mar.-Apr., 2000), pp. 1-6.*
Jennie S. Hwang and Zhenfeng Guo, "Effects of Pb Contamination on the Material Properties of Sn/Ag/Cu Solder," Chip Scale Review (Jan.-Feb., 2001), pp. 1-5.*
Y. M. Chow, W.M. Lau, and Z.S. Karim, "Surface Properties and Solderability Behaviour of Nickel- Phosphorous and Nickel-Boron Deposited by Electroless Plating," Surf. Interface Anal. vol. 31, (2001) pp. 321-327.*

(Continued)

*Primary Examiner*—Douglas W Owens
(74) *Attorney, Agent, or Firm*—Sughrue Mion, PLLC

(57) ABSTRACT

A wiring board comprising: a wiring laminate portion including dielectric layers containing polymeric material and conductor layers laminated alternately so as to form a first main surface out of one of said dielectric layers; and a plurality of metal terminal pads disposed on said first main surface; wherein: each of said metal terminal pads has a structure in which a Cu-plated layer is disposed on a side of said first main surface and an Au-plated layer is disposed in an outermost surface layer portion of said metal terminal pad, while an electroless Ni-plated layer having a P content not higher than 3% by weight is disposed as a barrier metal layer between said Cu-plated layer and said Au-plated layer.

38 Claims, 8 Drawing Sheets

OTHER PUBLICATIONS

Hisaaki Takao et al.; "Development of Highly Reliable Sn-Ag Lead-Free Solder Alloy"; vol. 35; No. 2; Jun. 2000; pp. 39-46, Abstract.

Masayoshi Date et al.; "Evaluation of Lead-Free Solder Balls Produced By Uniform Droplet Spray Method"; vol. 18; 2002; pp. 43-48, Abstract.

* cited by examiner

STEP 3

STEP 4

WIRING BOARD

FIELD OF THE INVENTION

The present invention relates to a wiring board.

BACKGROUND OF THE INVENTION

Japanese Patent Laid-Open No. 2002-4098, Japanese Patent Laid-Open No. 330336/1994, Japanese Patent Laid-Open No. 2003-13248, "evaluation of Lead-free Solder Balls Produced by Uniform Droplet Spray Method" Hitachi Metals Technical Review, Vol. 18 (2002), p. 43, and "Development of Highly Reliable Sn—Ag Lead-Free Solder Alloy" Toyota Central R&D Labs. R&D Review, Vol. 35, No. 2 (2000), p. 39 are background of the invention.

Of multi-layer wiring boards to be used for connecting chips such as ICs or LSIS, a wiring board called an organic package board has a wiring laminate portion in which dielectric layers of polymeric material and conductor layers have been laminated alternately. A plurality of metal terminal pads for flip-chip connection or mother board connection (for example, using BGA or PGA) are disposed on a first main surface formed out of one of the dielectric layers of the wiring laminate portion These metal terminal pads are conductively connected to inner conductor layers disposed in the wiring laminate portion, through vias. The inner conductor layers and the vias are generally formed out of Cu-based metal having a high conductivity. Each metal terminal pad has a body portion to be connected to the inner conductor layers and the vias, and the body portion is also formed as a Cu-plated layer. Solder will be in contact with each metal terminal pad for connection to a chip or a mother board. Thus, Au-plating is performed on the metal terminal pad in order to improve bonding power and wettability with the solder However, it cannot be said that the Cu-plated layer forming the body portion of each metal terminal pad is so high in corrosion resistance. Therefore, when the surface is covered with an oxide layer or the like, there is a possibility that the adhesion of the Au-plated layer deteriorates. In addition, Cu wells up by diffusion from the Cu-plated layer to the surface of the Au-plated layer due to heating during reflow or the like so that the surface of the Au-plated layer is covered with an oxide layer of Cu. Thus, there is a problem that the solder wettability or the solder bonding property is impaired on a large scale. In addition, an Sn component of the solder diffuses into the Cu-plated layer through the Au-plated layer, so as to produce a brittle Cu—SN-based intermetallic compound layer easily. Particularly when thermal stress or the like is applied, there is a problem that peeling is apt to occur between the Cu—SN-based intermetallic compound layer and the base portion of the Cu-plated layer. Particularly in a metal terminal pad for BGA (Ball Grid Array) for connecting the board to a mother board through a solder ball, the pad area is so large that thermal stress is also applied thereto easily. Thus, the aforementioned problem is apt to occur.

Therefore, the following pad structure is adopted broadly. That is, a Cu-plated layer is formed, an Ni-plated layer having good adhesion to Cu is then formed as a barrier metal layer on the Cu-plated layer, and an Au-plated layer is formed on the Ni-plated layer. To form the Ni-plated layer, there are two kinds of methods. One is a method using electrolytic Ni-plating, and the other is a method using electroless Ni-plating (Japanese Patent Laid-Open No. 2002-4098). However, in a pad forming process using electrolytic Ni-plating, a vermiculated plating tie bar to be connected to pads has to be formed on a dielectric layer surface (pad formation surface) on which the pads will be formed. In this method, a space to which the plating tie bar is inserted must be secured between the pads. As a result, the interval with which the pads are arrayed cannot be reduced to be shorter than a fixed value. Thus, there is a problem that the board area is apt to be increased, and restriction in design becomes very severe. On the other hand, when electroless Ni-plating is used, such a plating tie bar is unnecessary. Therefore, such a problem does not occur. In addition, there is an advantage that an Ni-plated layer can be formed easily by immersion in a plating solution, even on a plurality of pads isolated from one another on a dielectric layer.

SUMMARY OF THE INVENTION

However, phosphate such as sodium hypophosphite is used as a reducing agent in an electroless Ni-plating bath generally used for plating for pads of wiring boards. Therefore, only an Ni-plated layer inevitably containing a comparatively large amount of P in a range of from 4% by mass (% by weight) to 8% by mass can be obtained. When a large amount of P is contained in an Ni-plated layer, an Ni-based layer containing thickened P due to P or the like coprecipitated with Ni is formed during solder reflow. Thus, there is a fear that the wettability with solder is blocked so that there occurs a failure in connection. In addition, an Ni—Sn alloy layer formed by reaction between solder-side Sn and Ni may be formed in the Ni-based layer containing thickened P so as to be in contact therewith. Thus, there is another problem that peeling, breaking or the like is apt to occur in the interface between those layers.

It is an object of the invention to provide a wiring board in which a barrier metal layer capable of effectively suppressing component diffusion between a Cu-plated layer and an Au-plated layer of each metal terminal pad is disposed between the Cu-plated layer and the Au-plated layer, so that diffusion or reaction hardly occurs between the barrier metal layer and the Cu-plated layer or the Au-plated layer and the probability of failure in connection due to shortage of wettability with solder or occurrence of a defect such as peeling or breaking in the metal terminal pad can be therefore reduced on a large scale.

A wiring board according to the invention includes a wiring laminate portion having dielectric layers of polymeric material and conductor layers laminated alternately so as to form a first main surface out of one of the dielectric layers, and a plurality of metal terminal pads disposed on the first main surface formed out of the dielectric layer of the wiring laminate portion, wherein each metal terminal pad has a structure in which a Cu-plated layer is disposed on the first main surface side, and an Au-plated layer is disposed in an outermost surface layer portion of the metal terminal pad, while a barrier metal layer is inserted between the Cu-plated layer and the Au-plated layer. The barrier metal layer serves to suppress welling up of Cu from the Cu-plated layer to the surface of the Au-plated layer due to diffusion, and to suppress diffusion of solder components (particularly an Sn component in the case of solder containing Sn, such as Pb—Sn-based solder) to the Cu-plated layer through the Au-plated layer.

As a first configuration of the wiring board according to the invention, an electroless Ni-plated layer having a P content not higher than 3% by mass is disposed as the barrier metal layer to be disposed in the metal terminal pads. When the P-content of the electroless Ni-plated layer used as the barrier metal layer is made not higher than 3% by mass, the solder (particularly Sn—Pb-based solder) wettability to the metal terminal pads is improved on a large scale. Thus, a problem such as failure in connection becomes hard to occur. In addition, even when an Ni—Sn alloy layer is formed by reaction between solder-side Sn and Ni, a problem such as peeling and breaking becomes hard to occur, and hence a high-strength bonding state can be obtained easily. Incidentally, the phosphorus content of the electroless Ni-plated layer is preferably not higher than 1% by mass, more preferably not higher than a detection limit.

In this case, an Ni—B-based electroless Ni-plated layer may be used as the electroless Ni-plated layer. A nonphosphate-based bath using borohydride as a reducing agent is adopted in Ni—B-based electroless Ni-plating. Thus, the P-concentration in the Ni-plated layer can be reduced on a large scale. Incidentally,in the Ni—B-based electroless Ni-plating, hydrogen gas is generated during reduction reaction for Ni precipitation. When the hydrogen gas is entrained into the Ni-plated layer, there is a possibility that the absorbed hydrogen gas may be released during solder reflow to thereby cause bubbles or blisters between the Ni-plated layer and a solder connection portion. In this case, after the Ni—B-based electroless Ni-plated layer is formed, baking for dehydrogenation may be performed before the solder reflow process. It is desired to perform the baking at a temperature equal to or higher than the solder reflow temperature.

As a second configuration of the wiring board according to the invention, a platinum-metal-based electroless plated layer is disposed as the barrier metal layer to be disposed in the metal terminal pads. The barrier metal layer made of the platinum-metal-based electroless plated layer is excellent particularly in the effect of blocking Cu-diffusion: from the Cu-plated layer to the surface of the Au-plated layer, and the effect of blocking diffusion of solder components (particularly an Sn-component) to the Cu-plated layer through the Au-plated layer. As a result, the solder (particularly Sn—Pb-based solder) wettability to the metal terminal pads is improved so that the rate of occurrence of a problem such as failure in connection can be reduced on a large scale. In addition, even when an Ni—Sn alloy layer is formed by reaction between solder-side Sn and Ni, a problem such as peeling and breaking becomes hard to occur, and hence a high-strength bonding state can be obtained easily. When Ni—B-based electroless Ni-plated layer is used in the first configuration of the invention, there is a fear that absorbed hydrogen may be released during solder reflow to thereby cause bubbles or blisters between the Ni-plated layer and a solder connection portion as described previously. However, in the case where the platinum-metal-based electroless plated layer is used, hydrogen is not generated during plating reaction. Thus, there is no fear that such a problem occurs. Further, the platinum-metal-based electroless plated layer is extremely excellent in corrosion resistance, and the adhesion of the platinum-metal-based electroless plated layer to the Cu-plated layer-and the Au-plated layer is also improved.

The platinum-metal-based electroless plated layer may have any one of Pu, Rh, Pd, Os, Ir and Pt as its chief component (component highest in mass content). Specifically, a barrier metal layer made of an electroless Pd-plated layer is comparatively inexpensive, easy to form and excellent in performance. Thus, the electroless Ir-plated layer or the electroless Pd-plated layer can be preferably used in the invention. Though a barrier metal layer made of an electroless Ir-plated layer, an electroless Pt-plated layer, an electroless Rh-plated layer, or an electroless Ru-plated layer is somewhat expensive compared to the barrier metal layer made of an electroless Pd-plated layer, those are more excellent in corrosion resistance and those are more excellent in improving an adhesion to the Cu-plated layer and the Ni-plated layer in some case. In addition, because a diffusion coefficients of the electroless Pt-plated layer, the electroless Rh-plated layer, and the electroless Ru-plated layer to Cu are smaller than that of the electroless Pd-plated layer, those are more excellent, in some case, in the effect of blocking Cu-diffusion from the Cu-plated layer to the surface of the An-plated layer.

As a third configuration of the wiring board according to the invention, an Ni—P-based electroless Ni-plated layer in contact with the Cu-plated layer and a P-barrier electroless metal plated layer for blocking or suppressing P-diffusion from the Ni-P-based electroless Ni-plated layer to the Au-plated layer are disposed as the barrier metal layer to be disposed in the metal-terminal pads. The P-barrier electroless metal plated layer is disposed between the Ni—P-based electroless Ni-plated layer and the Au-plated layer. With this configuration, since the Ni—P-based electroless Ni-plated layer which has been already proved is used, the effect of blocking Cu-diffusion from the Cu-plated layer to the surface of the Au-plated layer and the effect of blocking diffusion of solder components (particularly an Sn component) to the Cu-plated layer through the Au-plated layer can be guaranteed without any problem. In addition, since the P-barrier electroless metal plated layer is disposed between the Ni—P-based electroless Ni-plated layer and the Au-plated layer and for blocking or suppressing P-diffusion from the Ni—P-based electroless Ni-plated layer to the Au-plated layer, a p-thickened layer possibly formed is isolated from the Au-plated layer by the P-barrier electroless metal plated layer. Thus, the solder (particularly Sn—Pb-based solder) wettability to the metal terminal pads can be improved on a large scale so that the rate of occurrence of a problem such as failure in connection can be reduced. In addition, even when an Ni—Sn alloy layer is formed by reaction between solder-side Sn and Ni, a problem such as peeling and breaking becomes hard to occur, and hence a high-strength bonding state can be obtained easily.

The P-barrier electroless metal plated layer may be made of an Ni—B-based electroless Ni-plated layer. The Ni—B-based electroless Ni-plated layer is excellent in adhesion to the Ni—P-based electroless Ni-plated layer because they are both Ni-plated layers.

Alternatively, the P-barrier electroless metal plated layer may be made of a platinum-metal-based electroless plated layer. The barrier metal layer made of the platinum-metal-based electroless plated layer is excellent particularly in the effect of blocking Cu-diffusion from the Cu-plated layer to the surface of the Au-plated layer and the effect of blocking diffusion of solder components (particularly an Sn component) to the Cu-plated layer through the Au-plated layer. In addition, hydrogen is not generated during plating reaction. Thus, there is no fear that the problem caused by hydrogen occurs. Further, the platinum-metal-based electroless plated layer is extremely excellent in corrosion resistance, and the adhesion of the platinum-metal-based electroless plated layer to the Cu-plated layer and the Au-plated layer is also improved. The platinum-metal-based electroless plated layer may have any one of Ru, Rh, Pd, Os, Ir and Pt as its chief component (component highest in mass content) Specifically, an electroless Ir-plated layer or an electroless Pd-plated layer can be preferably used in the invention.

As a fourth configuration of the wiring board according to the invention, an Ni—B-based electroless Ni-plated layer in contact with the Cu-plated layer and an Ni—P-based electroless metal plated layer thinner than the Ni—B-based-electroless Ni-plated layer are disposed as the barrier metal layer to be. disposed in the metal terminal pads. The Ni—P-based electroless metal plated layer is disposed between the Ni—B-based electroless Ni-plated layer and the Au-plated layer. Since the Ni—B-based electroless Ni-plated layer is used, the solder (particularly Sn—Pb-based solder) wettability to the metal terminal pads is improved on a large scale in the same manner as in the first configuration of the invention. Thus, a problem such as failure in connection becomes hard to occur. In addition, even when an Ni—Sn alloy layer is formed by reaction between solder-side Sn and Ni, a problem such as peeling and breaking becomes hard to occur, and hence a high-strength bonding state can be obtained easily. In addition, the Ni—P-based electroless metal plated layer is put between the Ni—B-based electroless Ni-plated layer and the Au-plated layer. Thus, even when hydrogen absorbed in the Ni—B-based electroless Ni-plated layer is released during solder reflow, there is no fear that bubbles or the like stay behind in the interface with the solder connection portion, because the Ni—P-based electroless metal plated layer which does not release hydrogen is put between the Ni—B-based electroless Ni-plated layer and the Au-plated layer, In addition, since the Ni—P-based electroless metal plated layer is formed to be thinner than the Ni—B-based electroless Ni-plated layer, the degree of formation of a P-thickened layer is so low that the fear of failure in solder wettability, failure in adhesion, or the like, is reduced. In this point of view, the Ni—P-based electroless metal plated layer is preferably adjusted to be not thicker than 2 µm, more preferably not thicker than 1 µm (the lower limit is, for example, set to be not lower than 0.5 µm in order to make the aforementioned effect conspicuous).

Incidentally, each metal terminal pad (for example, a BGA metal terminal pad) to be connected to a mother-board-side terminal pad through a solder ball has a large pad area so that thermal stress is applied thereto easily. Thus, the effect of the invention is especially conspicuous.

When the Ni-plated layer is in direct contact with the Au-plated layer, it is desired that the Au-plated layer is an electroless reduction Au-plated layer. From detailed researches made by the present inventor, it has been proved that when substitution Au-plating in the background art is applied to the Ni-plated layer, a very thin oxide film is formed between the substitution Au-plated layer and the Ni-plated layer. It can be considered that the strength of adhesion between the oxide film and the solder is low in the background art configuration so that peeling in the interface with solder is apt to occur.

Electroless substitution Au-plating uses potassium borohydride or dimethylamine borane as a reducing agent, while deposited metal is precipitated by substitution reaction with base metal on the plated side at least in the beginning of reaction. In order to advance the substitution reaction, Ni as the base metal has to be eluted into a plating bath. This elution is caused by the contact of the plating bath with the exposed portion of the base metal not covered with the deposited metal. In this event, an oxide film is formed on the surface of the base metal due to the contact of the base metal with the water-based plating bath. On the other hand, the deposited metal precipitated around the base metal also grows up to go round onto the oxide film. The oxide film is apt to stay behind in the interface between the plated layer formed thus and the base metal. However, when electroless reduction Au-based plating is applied as in the invention, an oxide film is hard to stay behind in the interface with the Ni-plated layer during the Au-plating. Thus, also after connection with solder, the adhesion between the solder and the Ni-plated layer increases so that peeling in the interface with the solder can be suppressed on a large scale.

Next, in recent years, so-called Pb-free solder containing no Pb (or, in case Pb is contained, the content of Pb is up to 3% by mass) has been used in place of conventional Sn—Pb eutectic solder in consideration of the issue of environmental pollution. Most of Pb-free solder is made from Sn as its chief component in the same manner as conventional eutectic solder, but contains Ag, Cu, Zu, Bi and the like as its accessory components in place of Pb used in the eutectic solder. Eclectic solder made from these elements mainly as its accessory components while still containing a small amount of Pb is also used. The Pb-free solder is short of ductility in comparison with the Sn—Pb eutectic solder. Thus, interface peeling occurs in the solder connection portion easily.

Sn—Pb eutectic solder generally often used has an Sn-38% by mass Pb eutectic composition, and the melting point thereof is 183° C. When the composition of the alloy is shifted either to the Pb-rich side or to the Sn-rich side, the melting point (liquidus) of the alloy increases. Simple Sn metal corresponds to the eutectic solder from which all of Pb has been removed simply, and its melting point is 232° C., which is near 50° C. higher than the melting point of the eutectic solder. Thus, it is difficult to use the simple Sn metal as alternative solder as it is.

Therefore, as for the Pb-free solder, eutectic formation components other than Pb has to be searched with Sn as a base component. The requirments for being each eutectic formation component other than Pb are as follows. (1) The effect of lowering the melting point is as large as possible (2) the component is inexpensive or the quantity of addition of the component can be reduced even if the component is expensive, (3) the component has excellent solderability or wettability and (4) the component is superior in corrosion resistance. However, kinds-of accessory components satisfying the requirements in a balanced manner are more limited than expected. Only several elements such as Zn, Bi, Ag and Cu satisfy the requirements. An Sn—Zn-based alloy has an eutectic point near 15% by mass of Zn, and the melting point thereof drops down to about 195° C. in that composition. However, Zn has a drawback in corrosion resistance. Thus, the quantity of addition of Zn is preferably kept at a value about 7–10% by mass. In a binary alloy close to such a composition, the melting point is reduced only to about 215° C. Therefore, even when the melting point is adjusted by adding 1–5% by mass of Bi, it is still difficult to obtain a melting point lower than 200° C. finally.

Further, since Bi is an expensive and strategic material, it also has difficulty in getting stable supply, On the other hand, Ag or Cu alone has a much higher melting point than Sn, but each of Ag and Cu has an eutectic point on the Sn-rich side. That is, an Sn—Ag-based alloy has an eutectic point near 5% by mass of Ag, and an Sn—Cu-based alloy has an eutectic point near 2% by mass of Cu. In addition, an Ag—Cu-based alloy is also eutectic, and the melting point can be further reduced when a ternary eutectic alloy of Sn—Ag—Cu is used. However, each of the Sn—Ag-based alloy and the Sn—Cu-based alloy has a binary eutectic temperature at about 220° C., and the melting point cannot be reduced to be 200° C. or lower even when the ternary eutectic alloy is used. Incidentally, in the case where the Sn—Ag-based alloy is used, the Ag content is not lower than 3% by mass and not higher than 6% by mass with respect to Sn in the composition recommended from the point of view of reduction in melting point. Similarly, in the case where the Sn—Cu-based alloy is used, the Cu content is not lower than 1% by mass and not higher than 3% by mass with respect to Sn. Further, in the case where the Sn—Ag—Cu alloy is used, the total content of Ag and Cu is not lower than 3% by mass and not higher than 6% by mass, and the mass ratio of Cu to the sum of Ag and Cu is not lower than 0.1 and not higher than 0.5.

As is apparent from the above discussion, when a solder ball is formed out of an Sn alloy obtained by reducing Pb content from an Sn—Pb eutectic solder on a large scale, it is inevitable that the solder ball becomes a high temperature solder ball whose melting point exceeds 200° C. (the upper limit is 232° C. in the case of Sn alone). For example, even in Pb-free solders having various compositions listed in Table 1 in "Development of Highly Reliable Sn—Ag Lead-Free Solder Alloy" Toyota Central R&D Labs. R&D Review, Vol. 35, No. 2 (2000), p. 39, their melting points (liquidus temperature) Ts are all 200° C. or higher. From the point of environmental conservation, an Sn alloy for forming the high temperature solder ball has a Pb content preferably not higher than 5% by mass (more preferably not higher than 1% by mass, and most preferably equal to 0% if possible, exclusive of one in an unavoidable impurity level.

In this case, with the increase of the solder bonding temperature, formation of a compound made up of Sn and Ni is advanced easily. This is disadvantageous from the point of view of solder bonding strength. However, according to the invention, reduction in bonding strength at least due to formation of a P-rich layer does not have to be concerned. Thus, the margin of reduction in strength due to the formation of the compound can be expanded so that a highly reliable solder bonding structure can be obtained. This effect is conspicuous particularly when the high temperature solder ball is bonded directly to a metal terminal pad.

Figure 1:
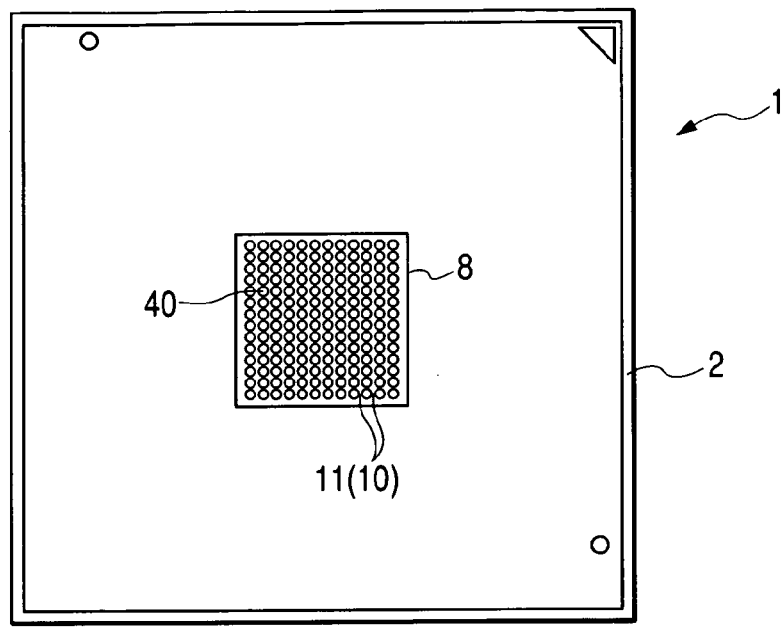
[FIG. 1]
It is a plan view showing each embodiment of a wiring board according to the invention,
[FIG. 2]
It is a back view of the same embodiment.

DESCRIPTION OF REFERENCE NUMERALS AND SIGNS 1 wiring board
6 dielectric layer
7 inner conductor layer
8,18 solder resist layer
L1,L2 wiring laminate portion
CP first main surface
10,17 metal terminal pad
34 via
52 Cu-plated layer
53 Ni-plated layer
21,22,121 barrier metal layer
54 Au-plated layer

DETAILED DESCRIPTION OF THE INVENTION

Embodiments of the invention will be described with reference to the drawings.

Figure 3:
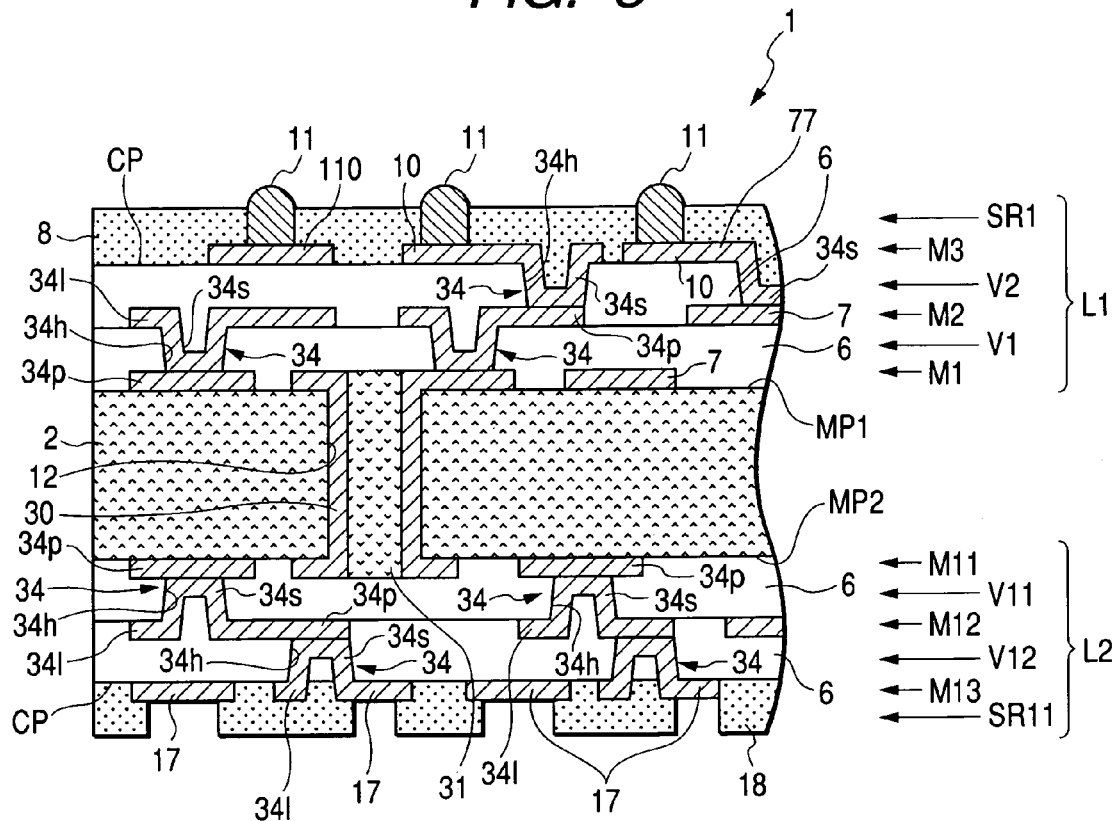
[FIG. 3]
It is a view showing an example of a sectional structure of the wiring board according to the invention,
[FIG. 4]
It is a view schematically showing a connection structure using a BGA pad.

FIG. 3 shows a sectional structure of a wiring board 1 according to each embodiment of the invention schematically. In the wiring board 1, core conductor layers M1 and M11 each forming a wiring metal layer in a predetermined pattern are formed on the opposite surfaces of a plate-like core 2 made of a heat resistant resin plate (such as a bismaleimide triazine resin plate), a fiber reinforced resin plate (such as a glass fiber reinforced epoxy resin plate) or the like respectively. Each core conductor layer M1, M11 is formed as a surface conductor pattern covering a major part of a surface of the plate-like core 2, and used as a power supply layer or a ground layer, on the other hand, a through hole 12 made by a drill or the like is formed in the plate-like core 2, and a through hole conductor 30 for achieving electric conduction between the core conductor layers M1 and M11 is formed in the inner wall surface of the through hole 12. In addition, the through hole 12 is filled with a hole filling material 31 made from resin such as epoxy resin.

In addition, first via layers (build-up layers; dielectric layers) V1 and V11 made from a photosensitive resin composition 6 are formed on the core conductor layers M1 and M11 respectively. Further, first conductor layers M2 and M12 each having metal wiring 7 are formed on the surfaces of the first via layers V1 and V11 respectively by Cu-plating. Incidentally, interlayer connection is established between the core conductor layers M1 and M11 and the first conductor layers M2 and M12 through corresponding vias 34 respectively. In the same manner, second via layers (build-up layers; dielectric layers) V2 and V12 made from the photosensitive resin composition 6 are formed on the first conductor layers M2 and M12 respectively. Second conductor layers M3 and M13 having metal terminal pads 8 and 18 respectively are formed on the surfaces of the second via layers V2 and V12 respectively. Interlayer connection is established between the first conductor layers M2 and M12 and the second conductor layers M3 and M13 through corresponding vias 34 respectively. Each via 34 includes a via hole 34h, via conductor 34s provided in the inner circumferential surface of the via hole 34h, a via pad 34p provided to be electrically connected to the via conductor 34s on the bottom side, and a via land 34l projecting outward from the circumferential edge of the opening of the via hole 34h on the opposite side to the via pad 34p.

Figure 4:
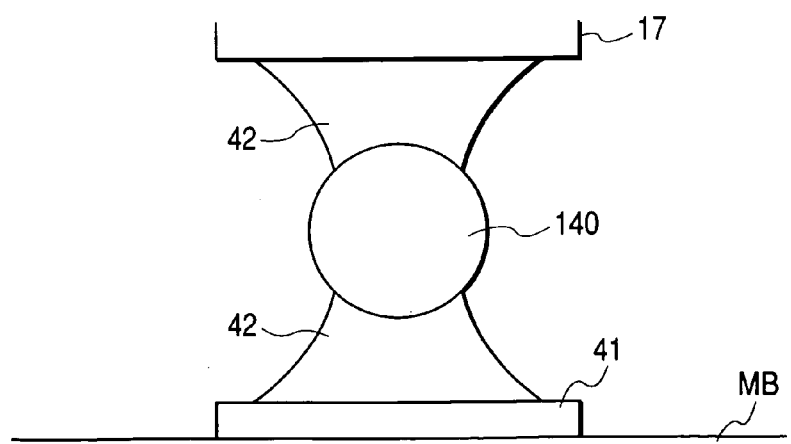

In a first main surface MP1 of the plate-like core 2, the core conductor layer M1, the first via layer V1, the first conductor layer M2 and the second via layer V2 form a first wiring laminate portion L1. On the other hand, in a second main surface MP2 of the plate-like core 2, the core conductor layer M11, the first via layer V11, the first conductor layer M12 and the second-via layer V12 form a second wiring laminate portion L2. In each wiring laminate portion, dielectric layers and conductor layers are laminated alternately so that a first main surface CP is formed out of one of the dielectric layers. On each first main surface CP, a plurality of metal terminal pads 10 or 17 are formed. Each metal terminal pad 10 on the side of the first wiring laminate portion L1 forms a solder land which is a pad for flip-chip connection with an integrated circuit chip or the like. On the other hand, each metal terminal pad 17 on the side of the second wiring laminate portion L2 is used as a back land (pad) for connecting the wiring board itself to a mother board or the like by a pin grid array (PGA) or a ball grid array (BGA). FIG. 4 shows an example in which the metal terminal pad 17 is formed as a BGA pad. In FIG. 4, the metal terminal pad 17 is connected to a terminal pad 41 on the mother board MH side through solder connection layers 42 (for example, made from a Pb—Sn alloy having an eutectic composition) and a solder ball (for example, formed out of high temperature solder made from a Pb—Sn alloy having a hypoeutectic composition or the above-described Pb-free solder) 140.

Figure 2:
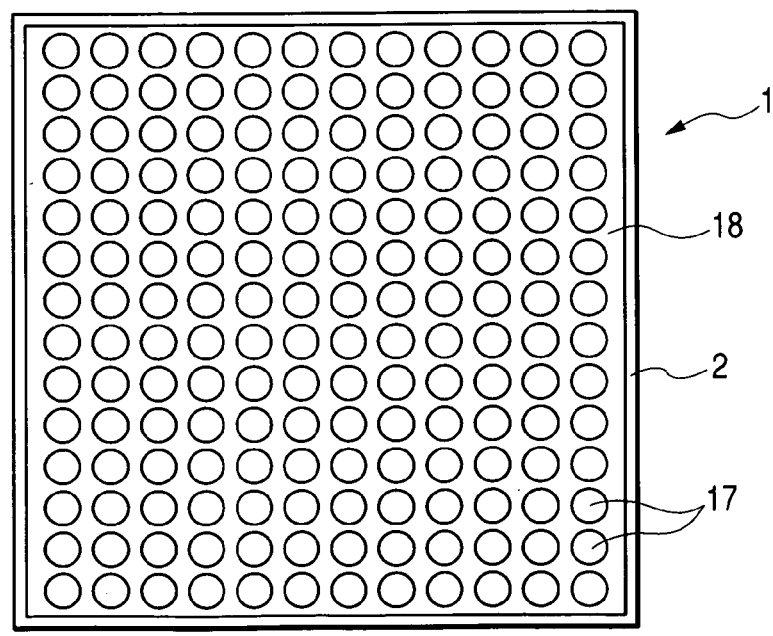

As shown in FIG. 1, the solder lands 10 are arrayed like a grid in a nearly central portion of the first main surface of the wiring board 1, so as to form a chip mounting portion 40 together with solder bumps 11 (FIG. 3) formed on the solder lands 10 respectively. In addition, as shown in FIG. 2, the back lands 17 in the second conductor layer M13 are also formed to be arrayed like a grid. Then, solder resist layers 8 and 18 (SR1 and SR11) each made from a photosensitive resin composition are formed on the second conductor layers MB and M13 respectively. Opening portions are formed one-to-one correspondingly to the lands 80 as to expose the solder lands 10 or the back lands 17.

For example, the via layers V1, V11, V2 and V12 and the solder resist layers 8 and 18 are produced as follows. That is, a photosensitive adhesive film formed out of vanish of a photosensitive resin composition is laminated, and a transparent mask (which is, for example, a glass mask) having a pattern corresponding to the via holes 34h is put on the top of the photosensitive adhesive film and exposed to light. The film portions other than the via holes 34h are cured by the exposure, while the portions of the via holes 34h survive as uncured portions. When the uncured portions are dissolved in a solvent and removed, the via holes 34h can be formed easily in a desired pattern (so-called photo-via process).

Figure 5:
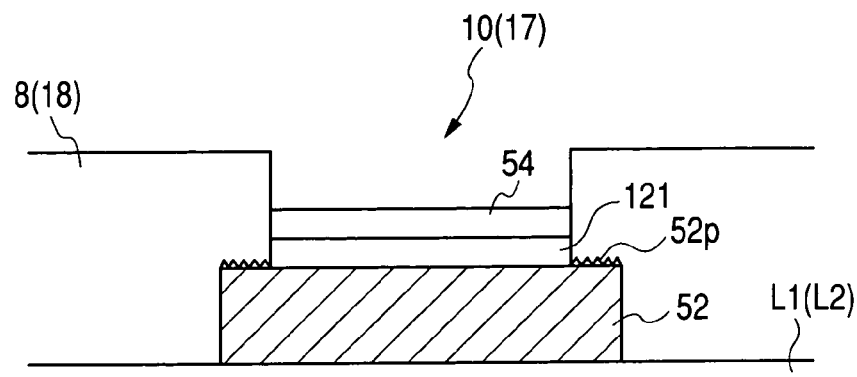
[FIG. 5]
It is a schematic sectional view showing a main portion of a metal terminal pad in a first embodiment of the invention.

FIG. 5 shows a specific example of the solder land 10 or the back land 17 (hereinafter the both will be collectively referred to as "metal terminal pad 10, 17"; integrative description will be made because their plated layers have one and the same laminate structure) in the wiring board according to the first embodiment of-the invention. In FIG. 5, a Cu-plated layer 52 an electroless Ni-plated layer 121 (preferably, with a thickness not smaller than 2 μm and not larger than 7 μm) having a P content not higher than 3% by mass and serving as a barrier metal layer, and an Au-plated layer 54 (formed by electroless Au-plating, preferably, with a thickness not smaller than 0.03 μm and not larger than 0.1 μm) are laminated in that order from the first main surface CP side of each wiring laminate portion L1, L2.

The electroless Ni-plated layer 121 is formed as an Ni—B-based electroless Ni-plated layer. A bath having nickel sulfate blended as a deposited metal source and borohydride (such as $NaBH_4$) added as a reducing agent is used. After the Ni—B-based electroless Ni-plated layer 121 is formed, baking for dehydrogenation may be performed, for example, at a temperature (up to about +50° C.) near or slightly higher than the solder reflow temperature.

Incidentally, the first main surface CP of each wiring laminate portion L1, L2 is covered with the solder resist layer 8, 18, and the inner circumferential edge of the opening of the solder resist layer 8, 18 is located to project to the inside of the main surface outer circumferential edge of the metal terminal pad 10, 17. Then, in the metal terminal pad 10, 17, an outer circumferential portion 52p of the Cu-plated layer 52 is in direct contact with the solder resist layer 8, 18, and surface roughening treatment is performed on the outer circumferential portion 52p. In addition, in the electroless Ni-plated layer 121 of the metal terminal pad 10, 17, only the area located inside the opening of the solder resist layer 8, 18 is covered with the Au-plated layer 54.

Figure 6:
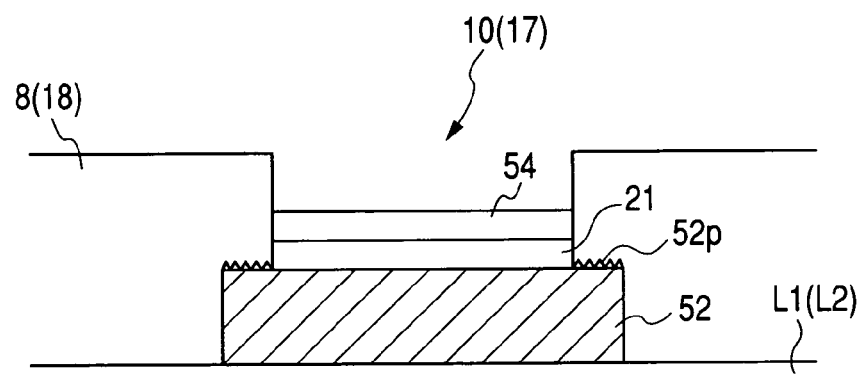
[FIG. 6]
It is a schematic sectional view showing a main portion of a metal terminal pad in a second embodiment of the invention.
Figure 7:
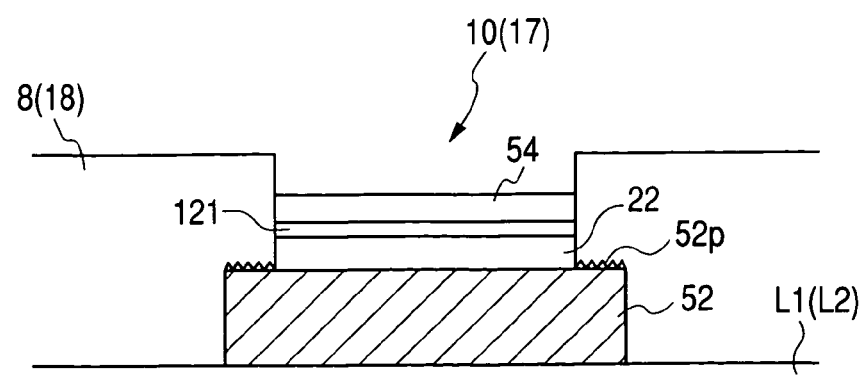
[FIG. 7]
It is a schematic sectional view showing a main portion of a metal terminal pad in a third embodiment of the invention.
Figure 8:
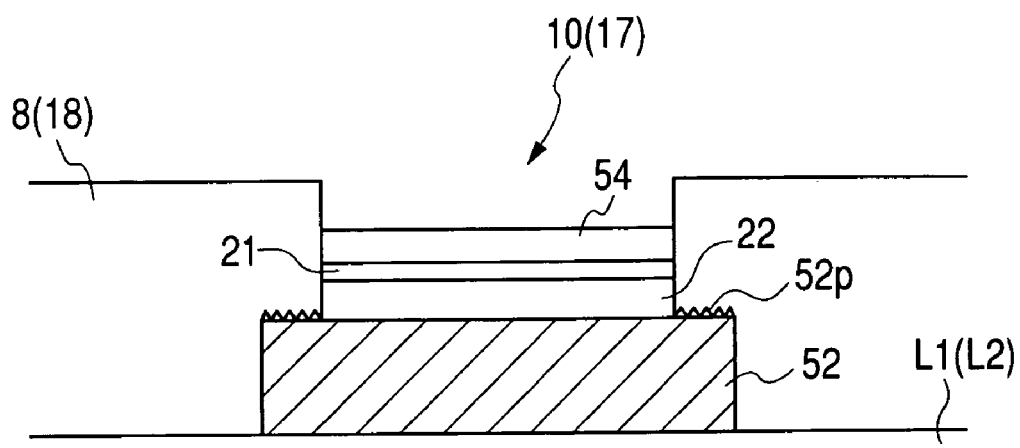
[FIG. 8]
It is a schematic sectional view showing a main portion of another example of the metal terminal pad in the third embodiment of the invention.

FIG. 6 shows a specific example of the metal terminal pad 10, 17 in the wiring board according to the second embodiment of the invention, in which the barrier metal layer is made of a platinum-metal-based electroless plated layer 21 (the other structure is similar to that in FIG. 5). The platinum-metal-based electroless plated layer 21 is an electroless Pd-plated layer (instead, an electroless Ir-plated layer, an electroless Pt-plated layer, an electroless Rh-plated layer or an electroless Ru-plated layer may be applied) preferably having a thickness of 0.05–1 μm (for example, 0.1 μm). For example, a bath having Pd (instead, Ir, Pt, Rh or Ru may be applied) chloride blended as a deposited metal source and sodium hypophosphite or hydrazine added as a reducing agent is used, FIG. 7 shows a specific example of the metal terminal pad 10, 17 in the wiring board according to the third embodiment of the invention, in which the barrier metal layer is made of an Ni—P-based electroless Ni-plated layer 22 (preferably, with a thickness not smaller than 2 μm and not larger than 7 μm) in contact with the Cu-plated layer 52, and an Ni—B-based electroless Ni-plated layer 121 (preferably, with a thickness not smaller than 0.05 μm and not larger than 2 μm, for example, a thickness of 1 μm) disposed between the Ni—P-based electroless Ni-plated layer 22 and the Au-plated layer 54 and serving as a P-barrier electroless metal plated layer (the other structure is similar to that in FIG. 5). The Ni—B-based electroless Ni-plated layer 121 blocks or suppresses P-diffusion from the Ni—P-based electroless Ni-plated layer 22 to the Au-plated layer 54. In addition, FIG. 8 shows a configuration in which the Ni—B-based electroless Ni-plated layer 121 as a P-barrier electroless metal plated layer in FIG., 7 is replaced by the platinum-metal-based electroless plated layer 21 (electroless Ir-plated layer or electroless Pd-plated layer).

Figure 9:
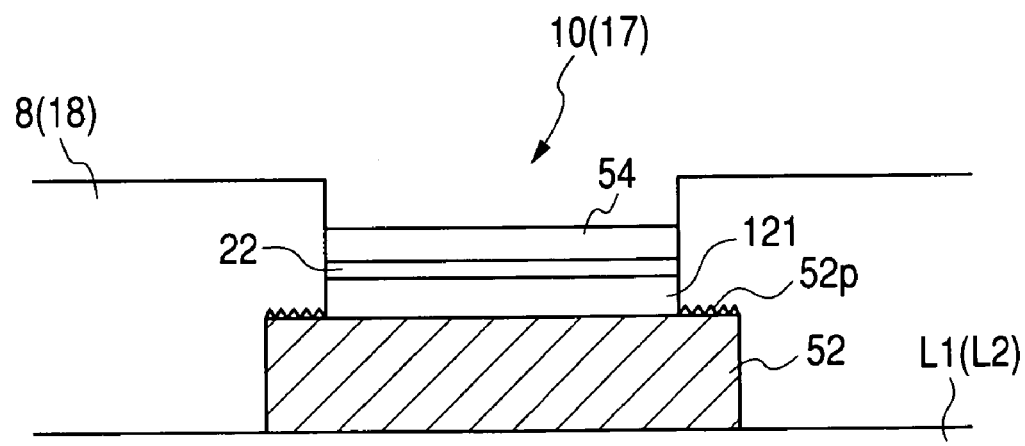
[FIG. 9]
It is a schematic sectional view showing a main portion of a metal terminal pad in a fourth embodiment of the invention.

FIG. 9 shows a specific example of the metal terminal pad 10, 17 in the wiring board according to the fourth embodiment of the invention, in which the barrier metal layer is formed out of an Ni—B-based electroless Ni-plated layer 121 (preferably, with a thickness not smaller than 2 μm and not larger than 7 μm) in contact with the Cu-plated layer 52, and an Ni—P-based electroless metal plated layer 22 (preferably, with a thickness not smaller than 0.05 μm and not larger than 2 μm, for example, a thickness of 1 μm) disposed between the Ni—B-based electroless Ni-plated layer 121 and the Au-plated layer 54 and having a thickness smaller than the Ni—B-based electroless Ni-plated layer 121 (the other structure is similar to that in FIG. 5). Due to the thin Ni—P-based electroless metal plated layer 22 put between the Ni—B-based electroless Ni-plated layer 121 and the Au-plated layer 54, even if hydrogen absorbed in the Ni—B-based electroless Ni-plated layer 121 is released during solder reflow, the Ni—P-based electroless metal plated layer 22 blocks the hydrogen. Thus, there is no fear that bubbles or the like stay behind in the interface with the solder connection portion. In addition, since the Ni—P-based electroless metal plated layer 22 is thin, the degree of formation of a P-thickened layer is so low that the fear of failure in solder wettability, failure in adhesion, or the like, is reduced.

Figure 10:
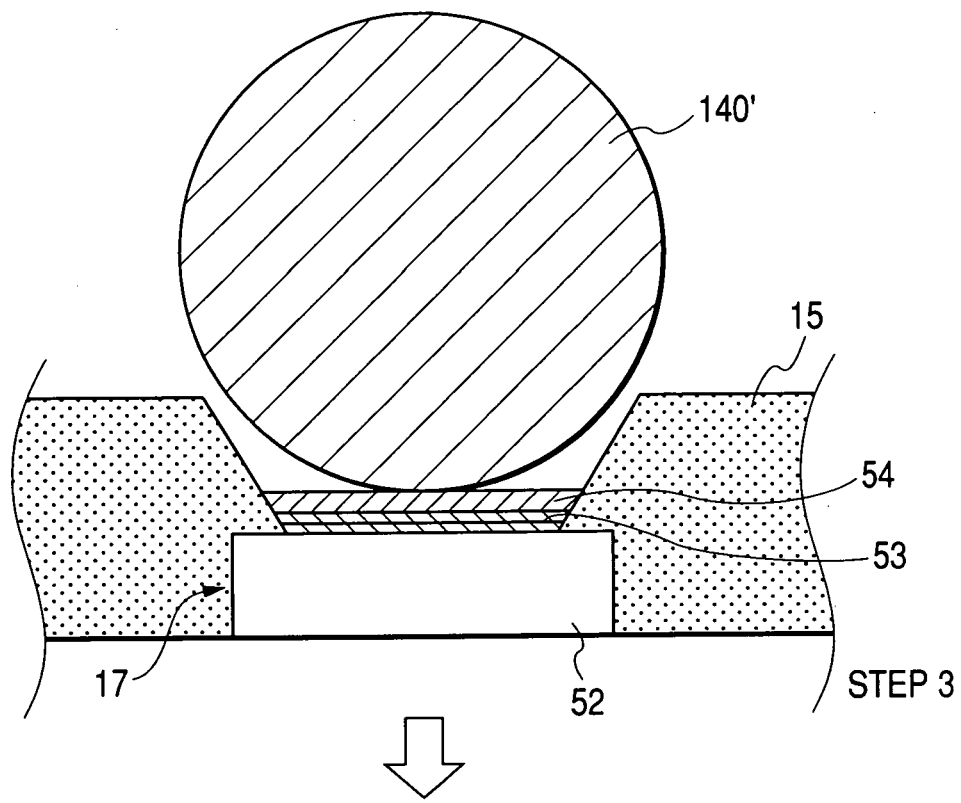
[FIG. 10]
It is an explanatory diagram showing a process for bonding a solder ball directly.
Figure 10:
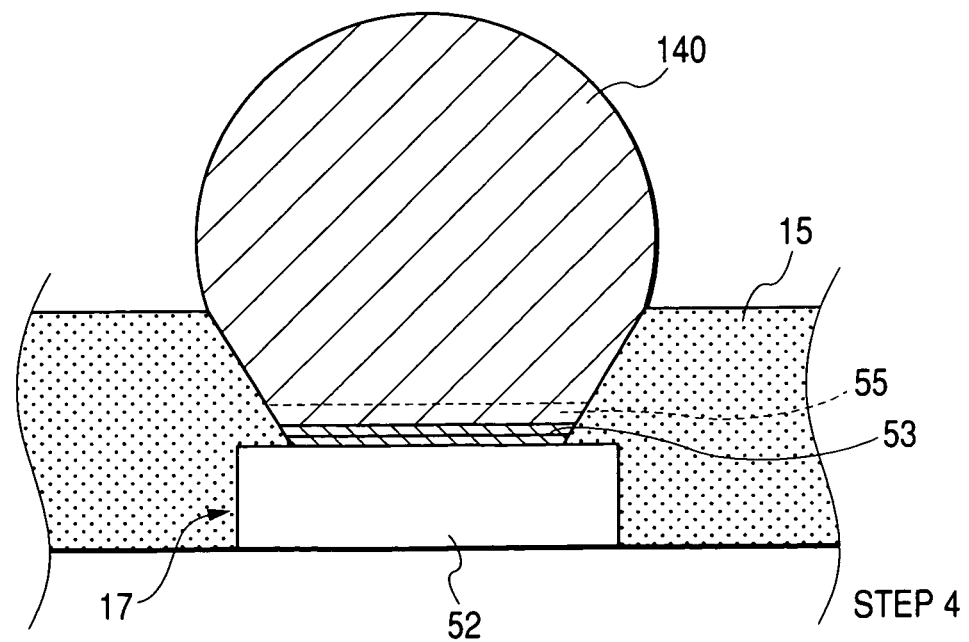

Incidentally, in each aforementioned embodiment, the solder ball 140 can be bonded directly to the metal terminal pad 17 as shown in FIG. 10. In this case, a solder ball 140' may be mounted on the pad 17 as shown in Step 3, and in that state the solder ball 140 may be heated to at least the melting point of the solder forming the ball, melted and bonded to the pad 17 as shown in Step 4.

In addition, the solder ball made from hypoeutectic solder may be replaced by a high temperature solder ball made from an Sn alloy such as an Sn—Ag—Cu alloy (for example, Sn-3% by mass Ag-0.5% by mass Cu), an Sn—Cu alloy (for example, Sn-2% by mass Cu), an Sn—Ag—Pb alloy, an Sn—Zn alloy (for example, Sn-10% by mass Zn) or an Sn—Zn—Bi alloy (for example, Sn-8% by mass Zn-3% by mass Bi), and having a melting point (liquidus temperature) not lower than 200° C.

When the solder ball 140 is bonded, the Au-plated layer 54 in the outermost surface portion originally formed in the pad 17 is melted and absorbed in the solder so that the Ni-plated layer 53 as a base is brought into contact with the solder ball 140. When the Ni-plated layer 53 (121, 22) shown in FIG. 10 is contact with the Au-plated layer 54 shown in FIGS. 5, 7 or 9, the Au-plated layer 54 may be formed as an electroless reduction Au-plated layer. Thus, the adhesive force between the solder ball 140 and the Ni-plated layer 53 can be enhanced on a large scale. The electroless reduction type Au-plating is a kind of autocatalytic type electroless Au-plating not depending on the substitution reaction with the base Ni metal. Examples of water-soluble Au salts serving as Au metal sources to be used in the Au-plating bath include dicyanoaurate(I) such as sodium dicyanoaurate(I) or ammonium dicyanoaurate(I), tetracyanoaurate(III) such as potassium tetracyanoaurate(III) sodium tetracyanoaurate(III) or ammonium tetracyanoaurate(III); gold(I) cyanide or gold(III) cyanide; dichloroaurate (I); tetrachloroauric(III) acid or tetrachloroaurate(III) such as sodium tetrachloroaurate(II); gold sulfite such as ammonium gold sulfite, potassium gold sulfite or sodium gold sulfite; gold oxide, gold hydroxide, and their alkali metal salts; and so on. However, the Au metal source is not limited to these water-soluble Au salts. Preferably the water-soluble Au salt is potassium dicyanoaurate(I), potassium tetracyanoaurate(III), sodium tetrachloroaurate(III), ammonium gold sulfite, potassium gold sulfite or sodium gold sulfite only one kind of water-soluble Au salt may be used, or two or more kinds of water-soluble Au salts may be mixed. It is appropriate that these water-soluble Au salts are contained, for example, by 0.1–10 g/L, preferably 1–5 g/L in terms of Au ion concentration. When the concentration is lower than 0.1 g/L, plating reaction is slow or difficult to occur. On the contrary, when a large amount is blended so that the concentration exceeds 10 g/L, conspicuous improvement in effect cannot be observed in proportion to the concentration. In addition, such a blend is not economical.

In addition, a complexing agent retains Au ions in the plating bath stably, but it does not allow nickel to dissolve in the plating bath substantially. Examples of such complexing agents include known chelating agents such as ethylenediaminetetraacetic acid, gold nitrites disclosed in Japanese Patent Laid-Open No. 330336/1994, and further organic phosphonic acid or phosphonate in which a molecule disclosed in Japanese Patent Laid-Open No. 2003-13248 has a plurality of phosphonic groups or salts thereof. For example, it is appropriate that the complexing agent is used in a range of from 0.005 mol/L to 0.5 mol/L, preferably in a range of from 0.02 mol/L to 0.2 mol/L. Particularly, it is preferable that the complexing agent is contained to be equimolar or in excess to Au ions contained in the plating bath. In addition, in order to suppress the formation of the oxide film, it is also effective that polyethyleneimine disclosed in Japanese Patent Laid-Open No. 2003-13248 is added to the Au-plating bath.

An example of a specific bath composition will be shown below:

potassium cyanoaurite: 2 g/L (in terms of gold ions)

ethylenediamine tetramethylene phosphonic acid: 0.15 mol/L polyethyleneimine (molecular weight 2,000): 5 g/L pH: 7.0

Description will be made below about the estimated reason why the bonding strength of the solder ball 140 to the pad 17 can be enhanced conspicuously by use of the reduction type electroless Au-plated layer as the Au-plated layer.

Figure 11:
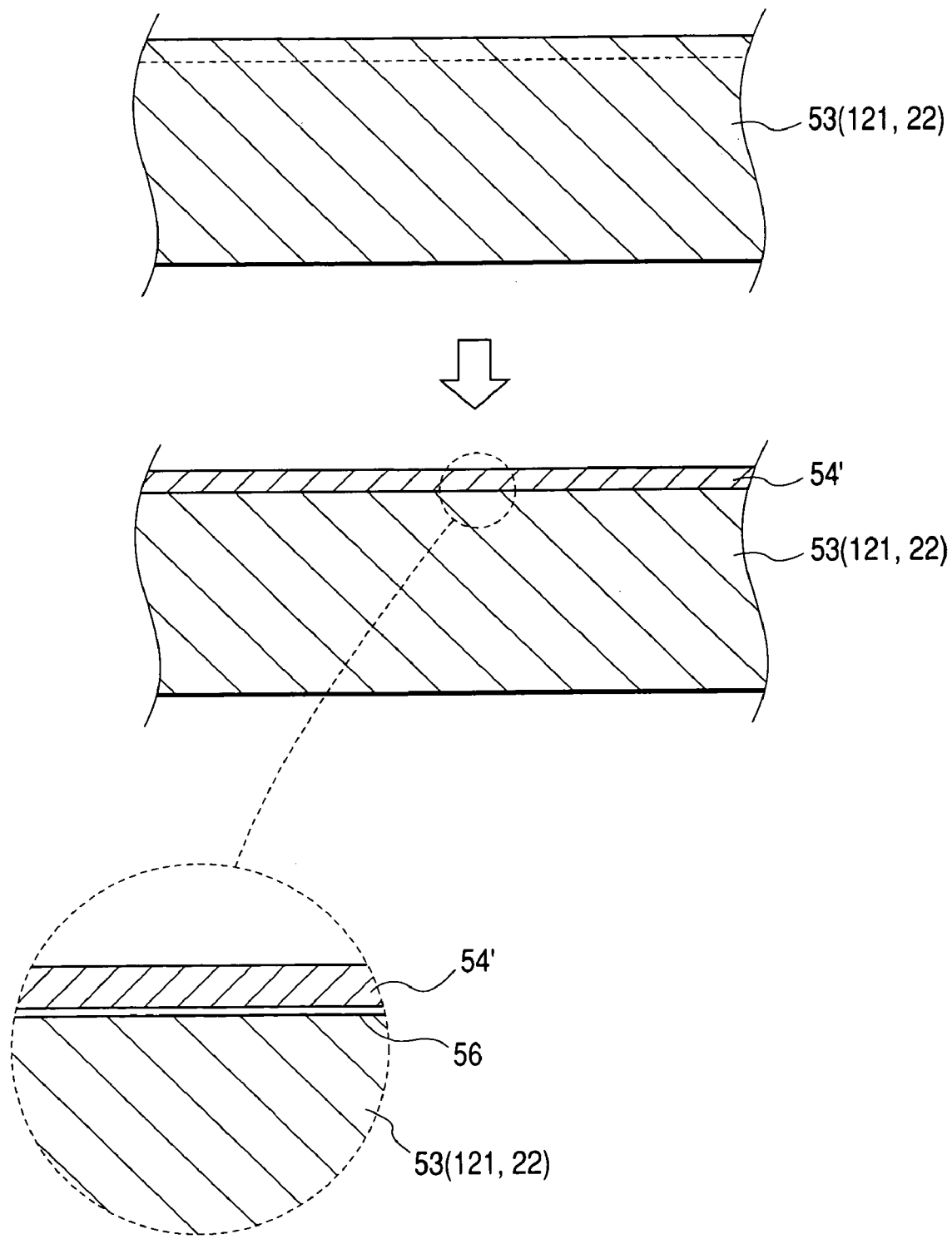
[FIG. 11]
It is an explanatory diagram showing a process for forming an Au-plated layer using reduction Au-plating in comparison with that using substitution Au-plating.

In FIG. 11, when an Au-plated layer is formed on the Ni-plated layer 53 as a substitution type Au-plated layer 54' in the background art, the plating bath touches the exposed portion of the base Ni not covered with deposited Au, and Ni is dissolved into the bath so that the substitution reaction between Au in the plating bath and Ni on the Ni-plated layer 53 side advances. In this event, as shown in the left lower of FIG. 11, an oxide film 56 is formed on the surface of the Ni-plated layer 53 by the contact with the water-based plating bath. On the other hand, Au deposited around the Ni-plated layer 53 also grows up to go round on to the oxide film 56. Thus, the oxide film 56 stays behind also in the interface between the Au-plated layer 54' formed thus and the Ni-plated layer.

Figure 13:
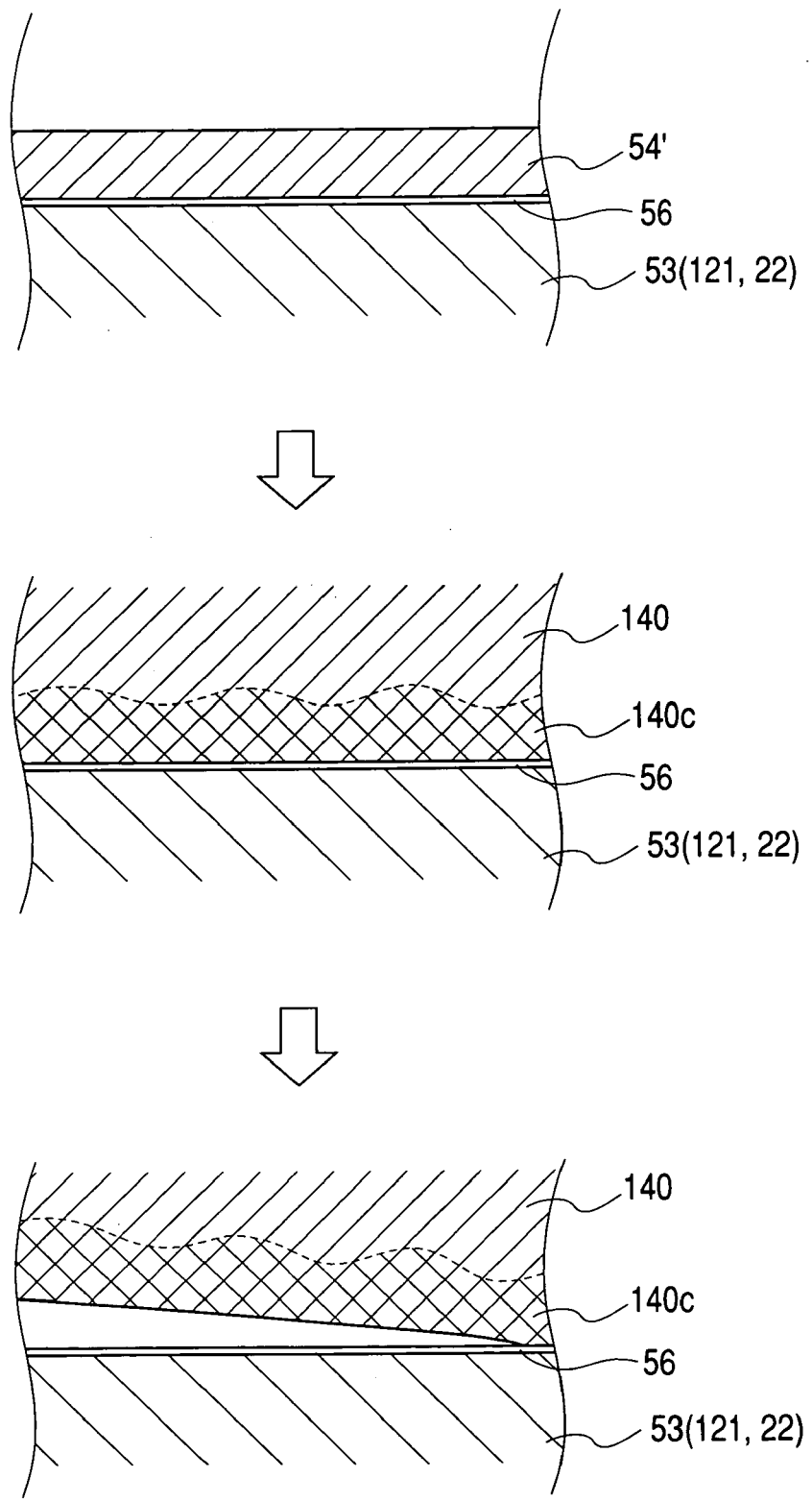
[FIG. 13]
It is a diagram for explaining the influence of an Ni—Sn compound layer on the bonding strength with solder.

When the solder ball 140 is bonded onto the pad 17 formed thus, the Au-plated layer 54' melts into the fused solder ball 140 so that the Ni-plated layer 53 is brought into contact with the solder 140 as shown in FIG. 13. The Ni component in the Ni-plated layer 53 penetrates the thin oxide film 56 and diffuses into the solder 140. Thus, the Ni component reacts with the Sn component of the solder 140 so as to form a somewhat brittle Ni—Sn compound layer 140c, which is in contact with the oxide film 56 formed under the Au-plated layer 54'. The adhesion strength between the oxide film 56 and the Ni—Sn compound layer 140c is so low that the bonding strength with the solder 140 is apt to be lowered.

Figure 12:
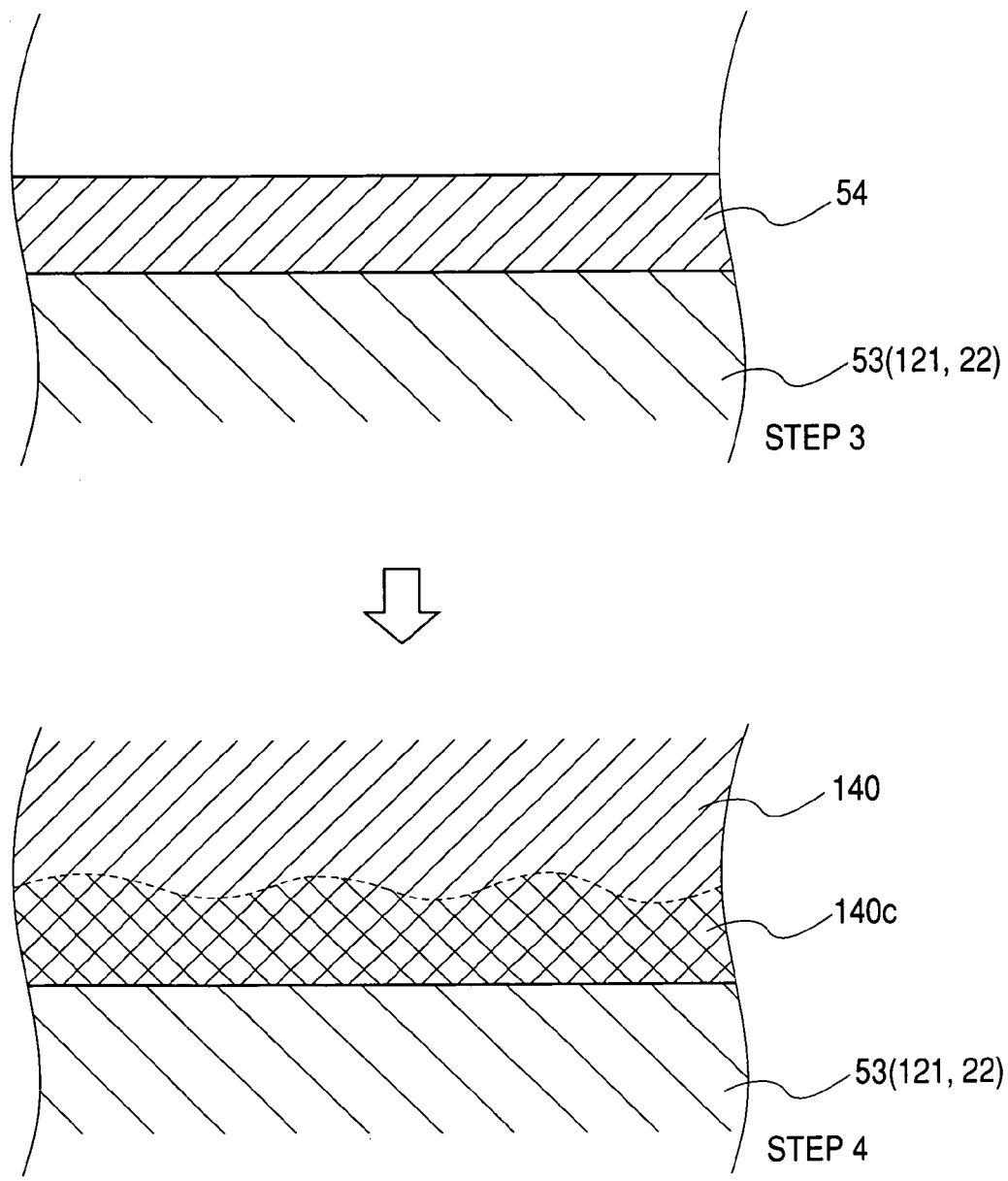
[FIG. 12]
It is a diagram for explaining an estimated effect producing mechanism of reduction Au-plating.

However, as shown in FIG. 12, the formation of such an oxide film is suppressed by use of the Au-plated layer 54 made of a reduction type electroless Au-plated layer, so that the bonding strength between the Ni-plated layer 53 and the solder ball 140 can be enhanced.

This application is based on-Japanese Patent application JP 2003-73767, filed Mar. 18, 2003, the entire content of which is hereby incorporated by reference, the same as if set forth at length.

What is claimed is:

1. A wiring board comprising:
a wiring laminate portion including dielectric layers containing a polymeric material and conductor layers laminated alternately so as to form a first main surface out of one of said dielectric layers; and
a plurality of metal terminal pads disposed on said first main surface, wherein:
each of said metal terminal pads has a structure in which a Cu-plated layer is disposed on a side of said first main surface and an Au-plated layer is disposed in an outermost surface layer portion of said metal terminal pad, while an electroless Ni-plated layer having a P content not higher than 3% by weight is disposed as a barrier metal layer between said Cu-plated layer and said Au-plated layer.

2. The wiring board according to claim 1, wherein said electroless Ni-plated layer is an Ni—B-based electroless Ni-plated layer.

3. The wiring board according to claim 1, wherein said electroless Ni-plated layer is in direct contact with said Au-plated layer, and said Au-plated layer is made of an electroless reduction Au-plated layer.

4. The wiring board according to claim 1, wherein said electroless Ni-plated layer has a thickness of from 2 to 7 μm and the Au-plated layer has a thickness of from 0.03 to 0.1 μm.

5. A wiring board comprising:
a wiring laminate portion including dielectric layers containing a polymeric material and conductor layers laminated alternately so as to form a first main surface out of one of said dielectric layers; and
a plurality of metal terminal pads disposed on said first main surface, wherein:
each of said metal terminal pads has a structure in which a layer containing Cu is disposed on a side of said first main surface and a layer containing Au is disposed in an outermost surface layer portion of said metal terminal pad, while a layer containing Ni which is an electroless Ni-plated layer having a P content not higher than 3% by weight is disposed as a barrier metal layer between said layer containing Cu and said layer containing Au layer.

6. A wiring board comprising:
a wiring laminate portion including dielectric layers containing a polymeric material and conductor layers laminated alternately so as to form a first main surface out of one of said dielectric layers; and
a plurality of metal terminal pads disposed on said first main surface;
wherein:
each of said metal terminal pads has a structure in which a Cu-plated layer is disposed on a side of said first main surface and an Au-plated layer is disposed in an outermost surface layer portion of said metal terminal pad, while a platinum-metal-based electroless plated layer is disposed as a barrier metal layer between said Cu-plated layer and said Au-plated layer.

7. The wiring board according to claim 6, wherein said platinum-metal-based electroless plated layer is an electroless Pd-plated layer.

8. The wiring board according to claim 6, wherein said platinum-metal-based electroless plated layer is an electroless Ir-plated layer, an electroless Pt-plated layer, an electroless Rh-plated layer or an electroless Ru-plated layer.

9. The wiring board according to claim 6, wherein said platinum-metal-based electroless plated layer has a thickness of 0.05–1 μm.

10. A wiring board with solder members, which comprises: the wiring board according to claim 6; and solder balls so that
said metal terminal pads are to be connected to motherboard-side terminal pads through said solder balls respectively, wherein said solder balls contains an Sn alloy whose liquidus temperature is not lower than 200° C.

11. The wiring board with solder members according to claim 10, wherein said solder balls are bonded directly to said metal terminal pads respectively.

12. The wiring board with solder members according to claim 11, wherein said solder balls contain one of an Sn—Ag-based alloy and an Sn—Cu alloy.

13. The wiring board with solder members according to claim 11, wherein said solder balls contain an Sn alloy having a Pb content not higher than 5% by mass.

14. A wiring board comprising:
a wiring laminate portion including dielectric layers containing a polymeric material and conductor layers laminated alternately so as to form a first main surface out of one of said dielectric layers; and
a plurality of metal terminal pads disposed on said first main surface;
wherein:
each of said metal terminal pads has a structure in which a layer containing Cu is disposed on a side of said first main surface and a layer containing Au is disposed in an outermost surface layer portion of said metal terminal pad, while a platinum-metal-based layer containing a metal selected from the group consisting of Ru, Rh, Pd, Os, Ir and Pt is disposed as a barrier metal layer between said layer containing Cu and said layer containing Au.

15. The wiring board according to claim 14, wherein the platinum-metal-based layer contains a metal selected from the group consisting of Ru, Rh, Pd, Os, Ir and Pt as a chief component.

16. A wiring board comprising:
a wiring laminate portion including dielectric layers containing a polymeric material and conductor layers laminated alternately so as to form a first main surface out of one of said dielectric layers; and
a plurality of metal terminal pads disposed on said first main surface,
wherein:
each of said metal terminal pads has a structure in which a Cu-plated layer is disposed on a side of said first main surface and an Au-plated layer is disposed in an outermost surface layer portion of said metal terminal pad, while an Ni—P-based electroless Ni-plated layer in contact with said Cu-plated layer and a P-barrier electroless metal plated layer for blocking or suppressing P-diffusion from said Ni—P-based electroless Ni-plated layer to said Au-plated layer are disposed as barrier metal layers between said Cu-plated layer and said Au-plated layer, said P-barrier electroless metal plated layer being disposed between said Ni—P-based electroless Ni-plated layer and said Au-plated layer.

17. The wiring board according to claim 16, wherein said P-barrier electroless metal plated layer is an Ni—B-based electroless Ni-plated layer.

18. The wiring board according to claim 16, wherein said P-barrier electroless metal plated layer is a platinum-metal-based electroless plated layer.

19. The wiring board according to claim 16, wherein said Au-plated layer is made of an electroless reduction Au-plated layer.

20. The wiring board according to claim 16, wherein said Ni—P-based electroless Ni-plated layer has a thickness of from 2 to 7 µm, and said P-barrier electroless metal plated layer has a thickness of from 0.05 to 2 µm.

21. A wiring board with solder members, which comprises: the wiring board according to claim 16; and solder balls so that said metal terminal pads are to be connected to mother-board-side terminal pads through said solder balls respectively, wherein said solder balls contains an Sn alloy whose liquidus temperature is not lower than 200° C.

22. The wiring board with solder members according to claim 21, wherein said solder balls are bonded directly to said metal terminal pads respectively.

23. The wiring board with solder members according to claim 22, wherein said solder balls contain one of an Sn—Ag-based alloy and an Sn—Cu alloy.

24. The wiring board with solder members according to claim 22, wherein said solder balls contain an Sn alloy having a Pb content not higher than 5% by mass.

25. A wiring board comprising:
a wiring laminate portion including dielectric layers containing a polymeric material and conductor layers laminated alternately so as to form a first main surface out of one of said dielectric layers; and
a plurality of metal terminal pads disposed on said first main surface,
wherein:
each of said metal terminal pads has a structure in which a Cu-plated layer is disposed on a side of said first main surface, and an Au-plated layer is disposed in an outermost surface layer portion of said metal terminal pad, while an Ni—B-based electroless Ni-plated layer in contact with said Cu-plated layer and an Ni—P-based electroless metal plated layer thinner than said Ni—B-based electroless Ni-plated layer are disposed as barrier metal layers between said Cu-plated layer and said Au-plated layer, said Ni—P-based electroless metal plated layer being disposed between said Ni—B-based electroless Ni-plated layer and said Au-plated layer.

26. The wiring board according to claim 25, wherein said Ni—P-based electroless metal plated layer is not thicker than 2 µm.

27. The wiring board according to claim 25, wherein said Au-plated layer is made of an electroless reduction Au-plated layer.

28. The wiring board according to claim 25, wherein said Ni—B-based electroless Ni-plated layer has a thickness of from 2 to 7 µm, and said Ni—P-based electroless metal plated layer has a thickness of from 0.05 to 2 µm.

29. A wiring board with solder members, which comprises: the wiring board according to claim 25; and solder balls so that said metal terminal pads are to be connected to mother-board-side terminal pads through said solder balls respectively, wherein said solder balls contains an Sn alloy whose liquidus temperature is not lower than 200° C.

30. The wiring board with solder members according to claim 29, wherein said solder balls are bonded directly to said metal terminal pads respectively.

31. The wiring board with solder members according to claim 30, wherein said solder balls contain one of an Sn—Ag-based alloy and an Sn—Cu alloy.

32. The wiring board with solder members according to claim 30, wherein said solder balls contain an Sn alloy having a Pb content not higher than 5% by mass.

33. A wiring board comprising:
a wiring laminate portion including dielectric layers containing a polymeric material and conductor layers laminated alternately so as to form a first main surface out of one of said dielectric layers; and
a plurality of metal terminal pads disposed on said first main surface,
wherein:
each of said metal terminal pads has a structure in which a layer containing Cu is disposed on a side of said first main surface, and a layer containing Au is disposed in an outermost surface layer portion of said metal terminal pad, while a layer containing Ni and B in contact with said layer containing Cu and a layer containing Ni and P thinner than said layer containing Ni and B are disposed as barrier metal layers between said layer containing Cu and said layer containing Au, said layer containing Ni and P being disposed between said layer containing Ni and B and said layer containing Au.

34. A wiring board comprising:
a wiring laminate portion including dielectric layers containing a polymeric material and conductor layers laminated alternately so as to form a first main surface out of one of said dielectric layers; and
a plurality of metal terminal pads disposed on said first main surface,
wherein:
each of said metal terminal pads has a structure in which a layer containing Cu is disposed on a side of said first main surface and a layer containing Au is disposed in an outermost surface layer portion of said metal terminal pad, while a layer containing Ni and P in contact with said layer containing Cu and a layer containing Ni and B are disposed as barrier metal layers between said layer containing Cu and said layer containing Au, said layer containing Ni and B being disposed between said layer containing Ni and P and said layer containing Au.

35. A wiring board with solder members, which comprises: the wiring board according to claim 1; and solder balls so that
said metal terminal pads are to be connected to mother-board-side terminal pads through said solder balls respectively, wherein said solder balls contains an Sn alloy whose liquidus temperature is not lower than 200° C.

36. The wiring board with solder members according to claim 35, wherein said solder balls are bonded directly to said metal terminal pads respectively.

37. The wiring board with solder members according to claim 36, wherein said solder balls contain one of an Sn—Ag-based alloy and an Sn—Cu alloy.

38. The wiring board with solder members according to claim 36, wherein said solder balls contain an Sn alloy having a Pb content not higher than 5% by mass.

* * * * *